(12) United States Patent
Hu

(10) Patent No.: US 10,304,786 B2
(45) Date of Patent: *May 28, 2019

(54) COMPOSITE CARRIER FOR WARPAGE MANAGEMENT

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/129,800

(22) Filed: Sep. 13, 2018

(65) Prior Publication Data

US 2019/0013280 A1    Jan. 10, 2019

Related U.S. Application Data

(62) Division of application No. 15/050,062, filed on Feb. 22, 2016, now Pat. No. 10,109,598.

(Continued)

(51) Int. Cl.
| | |
|---|---|
| *B32B 7/02* | (2019.01) |
| *H01L 23/00* | (2006.01) |
| *H01L 21/683* | (2006.01) |
| *B32B 7/12* | (2006.01) |
| *H01L 23/498* | (2006.01) |

(Continued)

(52) U.S. Cl.
CPC ............... *H01L 23/562* (2013.01); *B32B 7/02* (2013.01); *B32B 7/12* (2013.01); *H01L 21/486* (2013.01); *H01L 21/4857* (2013.01); *H01L 21/6835* (2013.01); *H01L 23/49822* (2013.01); *H01L 23/49827* (2013.01); *H05K 3/4682* (2013.01); *H01L 2221/68345* (2013.01); *H01L 2221/68359* (2013.01); *H05K 3/007* (2013.01); *H05K 2201/068* (2013.01); *H05K 2201/09136* (2013.01); *Y10T 428/24777* (2015.01)

(58) Field of Classification Search
CPC ............... H01L 23/562; H01L 21/6835; H01L 2221/68304–68395; H01L 2224/82001–82005; H01L 21/568; H05K 3/007; H05K 3/0097; H05K 2203/0152; H05K 2203/0156; H05K 2203/016; H05K 3/4682; Y10T 428/24488; Y10T 428/24777; B32B 3/02–08; B32B 1/04
USPC .................................................. 428/156, 192
See application file for complete search history.

(56) References Cited

U.S. PATENT DOCUMENTS

| | | | |
|---|---|---|---|
| 2004/0140547 A1* | 7/2004 | Yamazaki | H01L 21/6835 257/686 |
| 2013/0029475 A1* | 1/2013 | Tsukamoto | H01L 21/76898 438/459 |

(Continued)

FOREIGN PATENT DOCUMENTS

WO    WO-2013098530 A1 *    7/2013    ......... H01L 21/2007

*Primary Examiner* — Z. Jim Yang
(74) *Attorney, Agent, or Firm* — JCIPRNET

(57) ABSTRACT

A composite carrier is disclosed for warpage management as a temporary carrier in semiconductor process. Warpage is reduced for a product, semi-product, or build-up layer processed on the temporary composite carrier which is peeled off the temporary carrier in a later step. The composite carrier comprises a top substrate and a bottom substrate, an adhesive layer is configured in between the top substrate and a bottom substrate. One of the embodiments discloses the top substrate of the composite carrier having a lower CTE and the bottom substrate of the composite carrier having a higher CTE.

7 Claims, 8 Drawing Sheets

Related U.S. Application Data

(60) Provisional application No. 62/121,838, filed on Feb. 27, 2015.

(51) Int. Cl.
*H01L 21/48* (2006.01)
*H05K 3/46* (2006.01)
*H05K 3/00* (2006.01)

(56) References Cited

U.S. PATENT DOCUMENTS

| | | | |
|---|---|---|---|
| 2014/0242779 A1* | 8/2014 | Nakamura | H01L 25/50 438/459 |
| 2015/0206938 A1* | 7/2015 | Rossini | H01L 21/2007 428/426 |
| 2015/0373842 A1* | 12/2015 | Min | H05K 1/02 428/47 |
| 2017/0317017 A1* | 11/2017 | Ishihara | H01L 23/49822 |
| 2018/0053715 A1* | 2/2018 | Ishihara | H01L 23/49822 |
| 2018/0054888 A1* | 2/2018 | Ishihara | H05K 1/0284 |
| 2018/0054890 A1* | 2/2018 | Ishihara | H05K 1/113 |
| 2018/0054891 A1* | 2/2018 | Ishihara | H05K 1/0298 |

\* cited by examiner

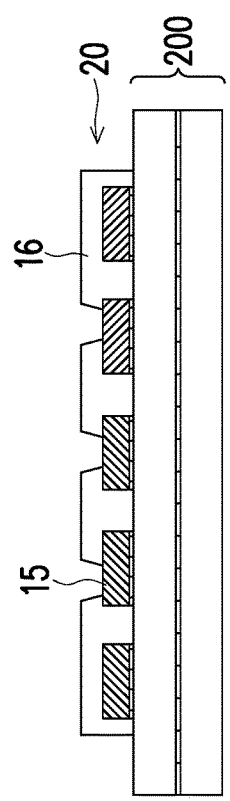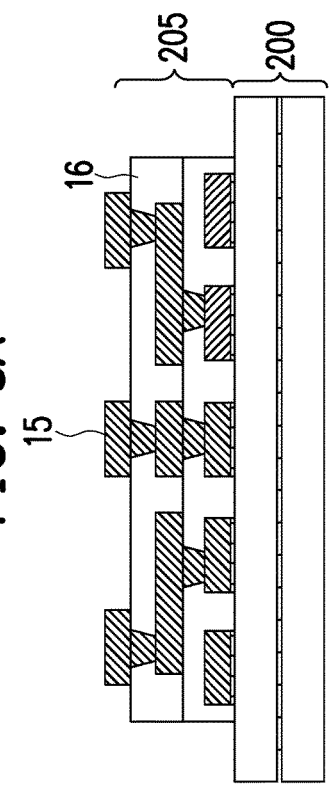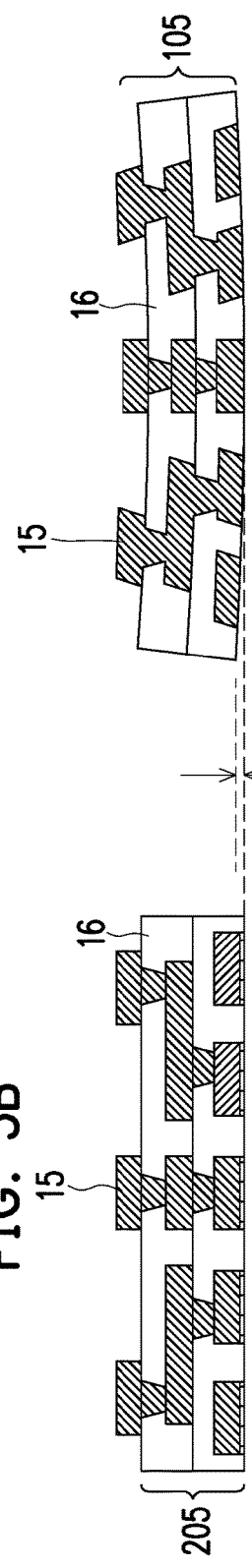

COMPOSITE CARRIER FOR WARPAGE MANAGEMENT

CROSS-REFERENCE TO RELATED APPLICATIONS

This application is a divisional application of and claims the priority benefit of U.S. application Ser. No. 15/050,062, filed on Feb. 22, 2016, now allowed, which claims the priority benefit to U.S. provisional application Ser. No. 62/121,838, filed on Feb. 27, 2015. The entirety of each of the above-mentioned patent applications is hereby incorporated by reference herein and made a part of specification.

BACKGROUND

Technical Field

The present invention relates to a temporary carrier used in a semiconductor process, especially for a composite carrier used as a temporary carrier for warpage management in a semiconductor process.

Description of Related Art

FIGS. 1A~1C Show a Prior Art

FIG. 1A shows that a build-up layer 10 is processed on top of a traditional carrier 1. The build-up layer process is taken as an example only. A different product or semi-product such as multi-chip package (not shown) can also be processed on top of the temporary carrier 1. In a later step, the processed product or semi-product is torn off the temporary carrier 1 for a further process.

FIG. 1B shows more build-up layers 10 have been made to form a second build-up layer 105. Both the carrier 1 and the build-up layer 105 experience expansion and shrinkage during semiconductor process, and warpage occurs due to a mismatch in Coefficient of Thermal Expansion (CTE) between the build-up layer 105 and the carrier 1.

FIG. 1C shows the build-up layer 10 detached from the carrier 1. The detached build-up layer 10 has been distorted. Such a distortion causes problems in registration in a later process for the product.

FIG. 2 Shows a Prior Art

FIG. 2 shows a prior art—U.S. Pat. No. 8,893,378, a temporary carrier 1 is sucked by a vacuum system to keep the temporary carrier 1 to be in a flat and from being distorted during semiconductor process with heating and cooling. A build-up layer, for example, can be processed on top of the temporary carrier 1. FIG. 2 shows that a cross-section view illustrating the principle of the prior art. A temporary carrier 1 is placed on an evacuable jig 3. The evacuable jig 3 has apertures 5 and a gas passage 7. The gas passage 7 is coupled to an evacuation device 9 such as a vacuum pump. The vacuum pump 9 sucks to keep the temporary carrier 1 flat all the time during semiconductor process. The prior art system designed for overcoming the CTE mismatch problem is expensive and complicated because it needs at least an evacuation device 9 and a jig 3. The additional equipment occupies large space which is unacceptable for conventional equipment in semiconductor process. A simple and easy handling method or device compatible with current equipment for a temporary carrier's warpage management is a long desirable solution in semiconductor industry.

BRIEF DESCRIPTION OF THE DRAWINGS

FIGS. 3A~3C show build-up layers processed on the composite carrier.

DETAILED DESCRIPTION OF THE INVENTION

Figure 1A:
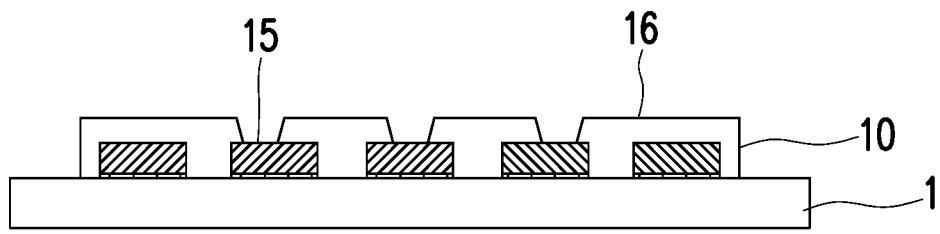
FIGS. 1A~1C show a prior art.
Figure 1B:
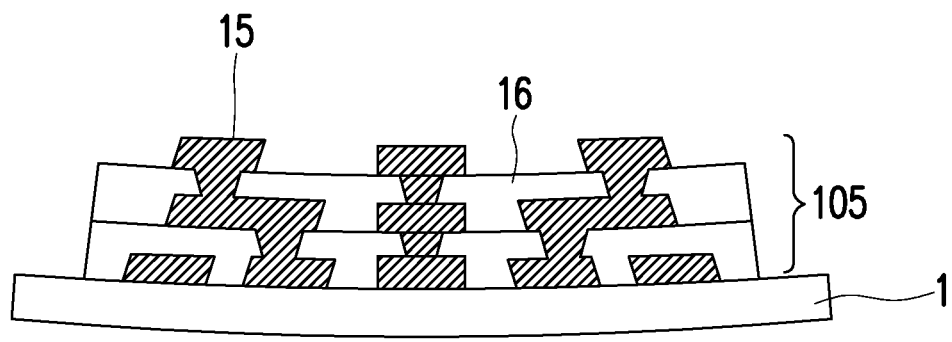

A temporary composite carrier is disclosed for warpage management in semiconductor process according to the present invention. Warpage is reduced for a Product, semi-product, or build-up layer processed on top of the temporary composite carrier according to the present invention. The temporary composite carrier according to the present invention has a sandwich structure which comprises a top substrate, a bottom substrate, and an adhesive layer. The adhesive layer is configured in between the top substrate and a bottom substrate for combining the substrates tight together. One of the embodiments discloses that the top substrate has a lower CTE and the bottom substrate has a higher CTE.

A first advantage for the present invention is that the composite carrier is a safe carrier to prevent chamber contamination if breakage occurs. No debris or only very little debris shall come off to contaminate the chamber, because any debris from breakage of one or both of the substrates shall be adhered to the adhesive layer.

A second advantage for the present invention is that the temporary composite carrier has a top substrate and a bottom substrate which can be with different CTE. For example, the top substrate is made of a material with a relative lower CTE and the bottom substrate is made of a material with a relative higher CTE. When a product, semi-product, or build-up layer is processed on top of the top substrate and with a higher CTE relative to the top substrate of the composite carrier, a stress of the bottom substrate shall offset at least partial stress from the one processed on the top substrate to reduce warpage of the top substrate as well as the one processed on top.

A third advantage for the present invention is that the top substrate and the bottom substrate may choose different thickness for a better stress matching in a specific case. Because in most cases, a mismatch in mechanical properties, such as CTE, between a temporary carrier and a product processed on top of the temporary carrier always exists. Based on the adjustable thickness, in combination of different CTE chosen for either one of the two substrates according to the present invention, the temporary composite carrier can be tailored to minimize the stress and warpage of the total structure, especially of the product, semi-product, or build-up layer . . . etc., processed on top.

FIGS. 3A~3C Show Build-Up Layers Processed on the Composite Carrier

FIG. 3A shows a build-up layer 20 made on top of a top substrate of the composite carrier 200.

FIG. 3B shows more build-up layers 20 have been made to form a second build-up layer 205. The composite carrier 200 experiences shrinkage and warpage after thermal shock during semiconductor process and due to the CTE mismatch between the build-up layer 20 and the composite carrier 200. However, FIG. 3B shows only very little warpage due to a stress of the bottom substrate of the composite carrier 200.

Build-up layer is taken as an example. Copper line 15 in the build-up layer roughly has a CTE around 17 ppm, and dielectric layer 16 in the build-up layer such as one of Polybenzoxazole (PBO), Polyimide (PI), or Benzocyclobuten (BCB), roughly has a CTE around 30 ppm; in combination the build-up layer 205 roughly has a CTE around 20 ppm.

The bottom substrate 21B is made of a material having a CTE larger than a CTE of the top substrate 21T so that a stress from the bottom substrate is able to offset some stress of the build-up layer 205 on top so that the warpage of the build-up layer 205 is reduced before or after it being detached from the temporary composite carrier 200.

FIG. 3C shows the build-up layer 205 detached from the carrier 200. The detached build-up layer 205 has very little distortion as compared with the build-up layer 105 fabricated on a traditional carrier 1.

Figure 1C:
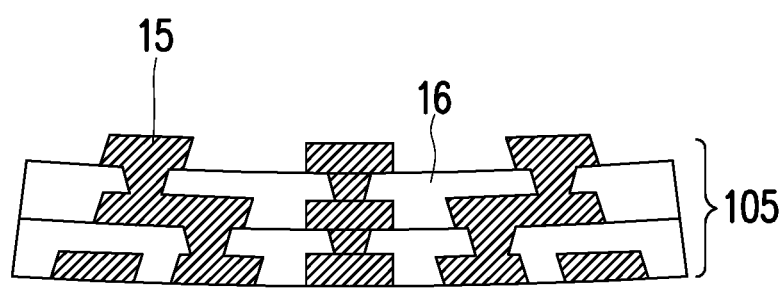
Figure 2:
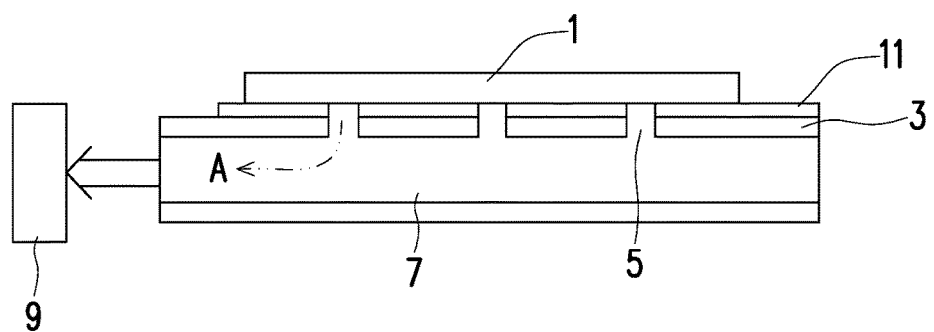
FIG. 2 shows a prior art.

Further referring to FIG. 3C, compared with FIG. 1C, the traditional build-up layer 105 has a distortion as indicated as distance 24. The build-up layer 205 of FIG. 3C according to the present invention has significant less distortion than the traditional build-up layer 105 of FIG. 1C.

Figure 4A:
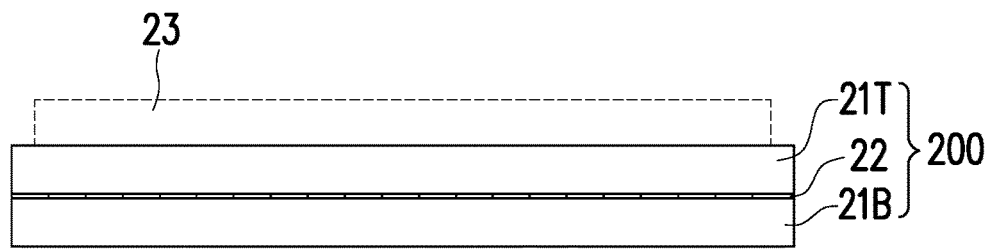
FIG. 4A shows a first embodiment of the composite carrier according to the present invention.

FIG. 4A Shows a First Embodiment of the Composite Carrier According to the Present Invention FIG. 4A shows a composite carrier 200 which comprises a top substrate 21T, an adhesive layer 22 is configured on bottom of the top substrate 21T, and a bottom substrate 21B is configured on bottom of the adhesive layer 22. The top substrate 21T is made of a material selected from a group consisting of silicon, glass, copper clad laminate (CCL), silicon carbide (SiC), stainless steel, alloy 42, and ceramic including Aluminum Oxide ($Al_2O_3$, ~7 ppm), Aluminum Nitride (AlN, 5 ppm), and Zirconiz ($ZrO_2$, ~10.5 ppm). The bottom substrate 21B is made of a material selected from a group consisting of silicon, glass, copper clad laminate (CCL), silicon carbide (SiC), stainless steel, alloy 42, and ceramic. A top area 23 of the top substrate 21T provides area for semiconductor process thereon.

No debris or only very little debris shall come off from the composite carrier 200 to contaminate the chamber, because any debris from breakage of one or both of the substrates of the composite carrier 200 shall adhere to the adhesive layer 22.

Figure 4B:
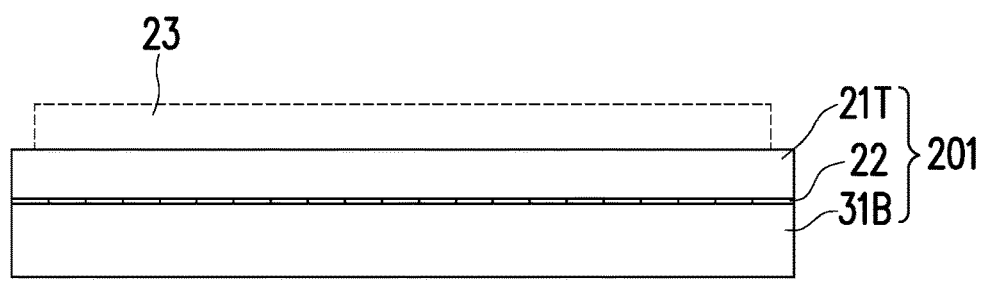
FIG. 4B shows a second embodiment of the composite carrier according to the present invention.

FIG. 4B Shows a Second Embodiment of the Composite Carrier According to the Present Invention FIG. 4B shows that a composite carrier 201 has a top substrate 21T and a bottom substrate 31B. An adhesive layer is configured in between the top substrate 21T and the bottom substrate 31B. A thickness of the bottom substrate 31B is thicker than a thickness of the top substrate 21T. The higher thickness of the bottom substrate 31B provides higher stiffness to withstand the bending or distortion for the product being processed on top 23 of the top substrate 21T.

Figure 4C:
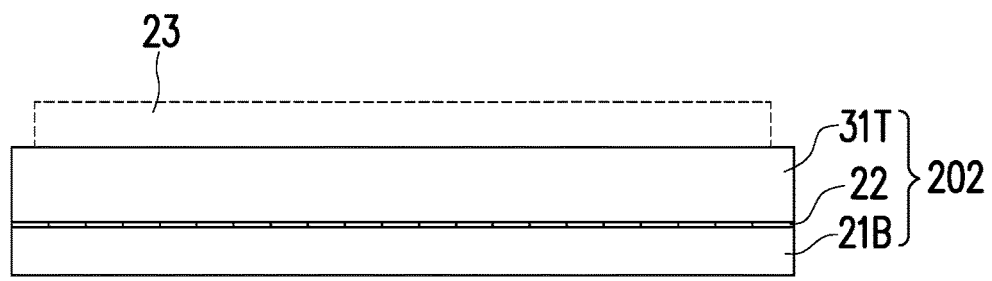
FIG. 4C shows a third embodiment of the composite carrier according to the present invention.

FIG. 4C Shows a Third Embodiment of the Composite Carrier According to the present invention FIG. 4C shows that a composite carrier 202 has top substrate 31T and a bottom substrate 21B. A thickness of the top substrate 31T is thicker than a thickness of the bottom substrate 21B. The higher thickness of the top substrate 31T provides higher stiffness to withstand the bending or distortion for the product being processed on top 23 of the top substrate 31T.

Figure 5:
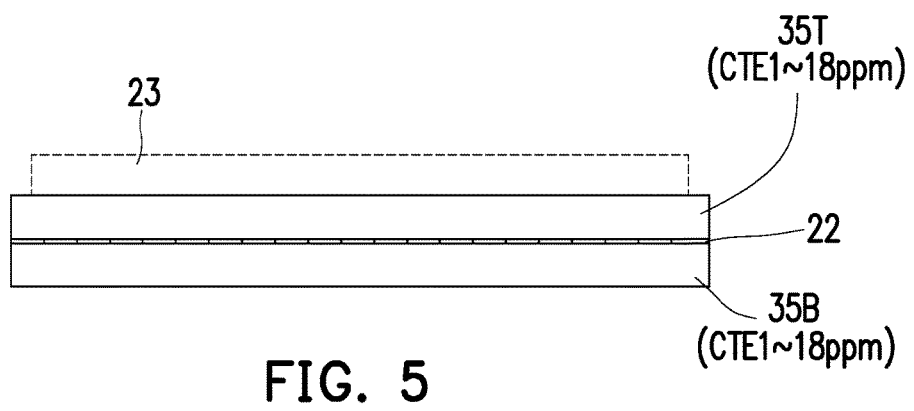
FIG. 5 shows a fourth embodiment of the composite carrier according to the present invention.

FIG. 5 Shows a Fourth Embodiment of the Composite Carrier According to the Present Invention FIG. 5 shows a composite carrier for warpage management. FIG. 5 shows either one of the top substrate 35T or the bottom substrate 35B is made of a material having a CTE around 1~18 ppm. The material of the top substrate 35T can be the same as the material of the bottom substrate 35B. Alternatively, the material of the top substrate 35T can be different from the material of the bottom substrate 35B.

The material for the substrate can be used is one selected from the group consisting of:
Invar having a CTE around 1 ppm,
Aluminum Nitride having a CTE around 5 ppm,
Silicon having a CTE around 3 ppm,
Glass having a CTE around 4 ppm,
Alloy 42 having a CTE around 4.8 ppm,
Cemented Carbide having a CTE around 5.5 ppm,
Aluminum Oxide having a CTE around 7 ppm,
Alumina having a CTE around 7.2 ppm,
Titanium having a CTE around 8.6 ppm,
Zirconia having a CTE around 10.5 ppm,
Glass having a CTE around 0~10 ppm, and
Stainless Steel having a CTE around 10~18.0 ppm.

Figure 6:
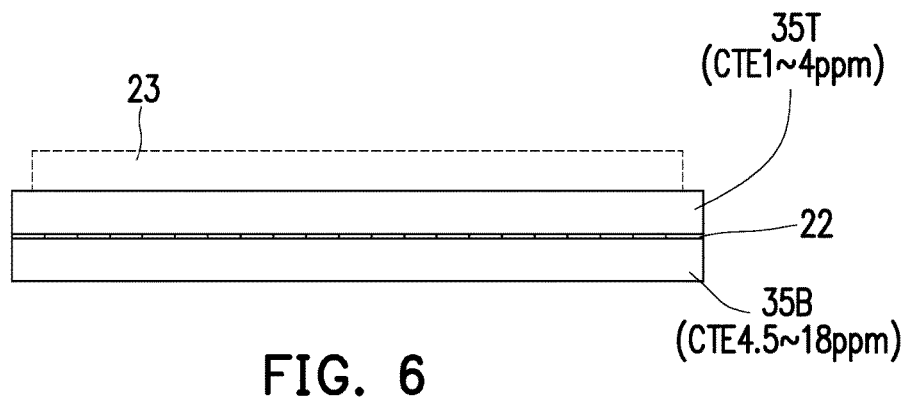
FIG. 6 shows a fifth embodiment of the composite carrier according to the present invention.

FIG. 6 Shows a Fifth Embodiment of the Composite Carrier According to the Present Invention FIG. 6 shows that the material of the top substrate 35T is different from the material of the bottom substrate 35B. The material of the top substrate 35T is selected from a material having CTE from 1~4 ppm; and the material of the bottom substrate 35B is selected from a material having a CTE from 4.5~18 ppm.

Figure 7:
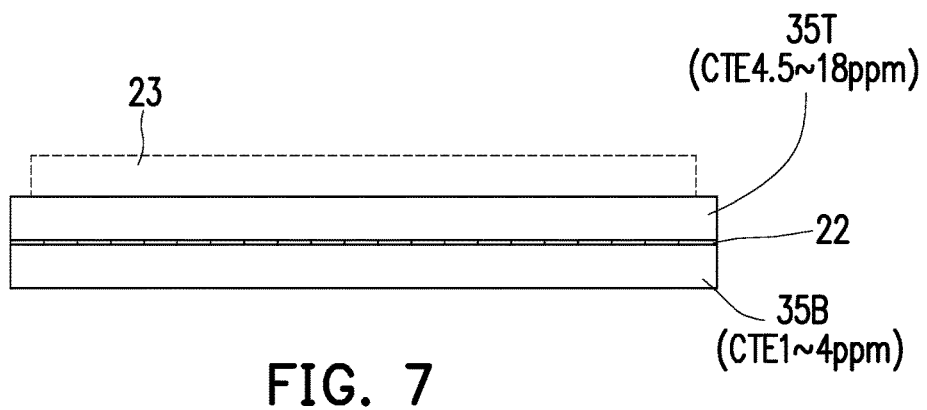
FIG. 7 shows a sixth embodiment of the composite carrier according to the present invention.

FIG. 7 Shows a Sixth Embodiment of the Composite Carrier According to the Present Invention FIG. 7 shows that the material of the top substrate 35T is different from the material of the bottom substrate 35B. The material of the top substrate 35T is selected from a material having CTE from 4.5~18 ppm; and the material of the bottom substrate 35B is selected from a material having a CTE from 1~4 ppm.

Figure 8A:
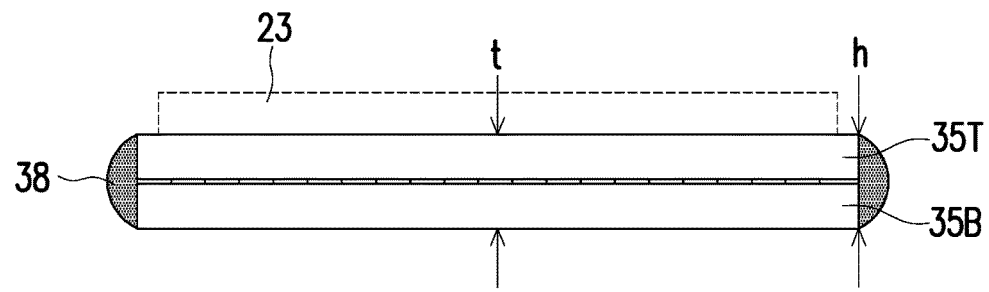
FIGS. 8A~8C show modified embodiments according to the present invention.
Figure 8B:
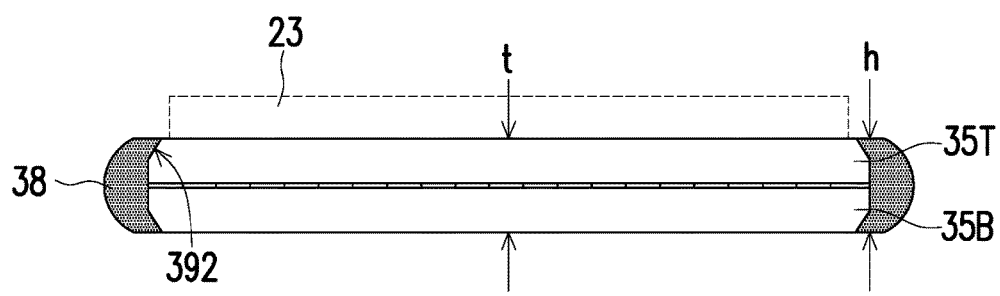
Figure 8C:
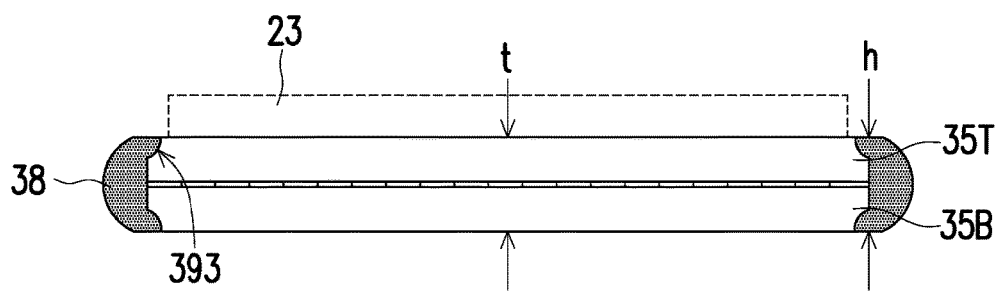

FIG. 8A~8C Show Modified Embodiments According to the Present Invention

FIG. 8A shows polymer 38 wrapping around a peripheral side of the top substrate 35T and the bottom substrate 35B of the composite carrier to enhance the rigidity of the composite substrate. The polymer 38 has a thickness h equivalent to the thickness t of the composite substrate. The polymer 38 protrudes out smoothly in a direction parallel with a surface of the substrate.

FIG. 8B shows a flat chamfer 392 is made on the corner of the substrate 35T, 35B.

FIG. 8C shows a curve chamfer 393 is made on the corner of the substrate 35T, 35B.

While several embodiments have been described by way of example, it will be apparent to those skilled in the art that various modifications may be configured without departs from the spirit of the present invention. Such modifications are all within the scope of the present invention, as defined by the appended claims.

What is claimed is:
1. An assembly comprising:
a composite carrier and a multi-layer structure detachably placed upon the composite carrier, wherein:
the multi-layer structure comprises a plurality of build-up layers, wherein each build-up layer comprises a plurality of metal layers embedded in a dielectric layer, and wherein adjacent build-up layers are electrically connected; and the composite carrier comprises:
a polymer;
a top substrate;
a bottom substrate below the top substrate; and
an adhesive layer between the top substrate and the bottom substrate, the adhesive layer bonding the top substrate to the bottom substrate;
wherein
each of the top substrate, the bottom substrate and the adhesive layer has:
respective top and bottom surfaces opposite to each other in a thickness direction of the composite carrier,
a respective side surface extending in the thickness direction and connecting the respective top and bottom surfaces;
a top planar surface of the polymer is flush with the top surface of the top substrate, and a bottom planar surface of the polymer is flush with the bottom surface of the bottom substrate;
a first chamfer of the top substrate extends between the top surface of the top substrate and the side surface of the top substrate, and a second chamfer of the bottom substrate extends between the bottom surface of the bottom substrate and the side surface of the bottom substrate;
the polymer wraps around the side surface of each of the top substrate, the adhesive layer and the bottom substrate; and
in a cross-section taken in a plane perpendicular to the top surface of the top substrate, the polymer has an outer surface curved and convex outwardly away from the top substrate, the adhesive layer and the bottom substrate;
wherein the top surface of the top substrate includes an area for semiconductor processing thereon, wherein the multi-layer structure is arranged on and detachable from the area of the top surface of the top substrate; and
the area for semiconductor processing on the top surface of the top substrate is free of the polymer.

2. The assembly as claimed in claim 1, wherein the top substrate has a lower CTE than the bottom substrate.

3. The assembly as claimed in claim 1, wherein
one of the top substrate and the bottom substrate is made of a material selected from the group consisting of:
Invar having a coefficient of thermal expansion (CTE) around 1 ppm,
silicon (Si) having a CTE around 3 ppm,
cemented carbide having a CTE around 5.5 ppm,
aluminum (Al) having a CTE around 7.2 ppm,
titanium (Ti) having a CTE around 8.6 ppm,
copper clad laminate (CCL) having a CTE around 1~17 ppm,
stainless steel having a CTE around 10~18.0 ppm,
Alloy 42 having a CTE around 4.8 ppm,
aluminum nitride (AlN) having a CTE around 5 ppm, and
zirconia ($ZrO_2$) having a CTE around 10.5 ppm, and
the other of the top substrate and the bottom substrate is made of a material selected from the group consisting of:
Invar having a coefficient of thermal expansion (CTE) around 1 ppm,
silicon (Si) having a CTE around 3 ppm,
cemented carbide having a CTE around 5.5 ppm,
aluminum (Al) having a CTE around 7.2 ppm,
titanium (Ti) having a CTE around 8.6 ppm,
glass having a CTE around 0~10 ppm,
copper clad laminate (CCL) having a CTE around 1~17 ppm,
stainless steel having a CTE around 10~18.0 ppm,
Alloy 42 having a CTE around 4.8 ppm,
Aluminum oxide ($Al_2O_3$) having a CTE around 7 ppm,
aluminum nitride (AlN) having a CTE around 5 ppm, and
zirconia ($ZrO_2$) having a CTE around 10.5 ppm.

4. The assembly as claimed in claim 1, wherein
in the thickness direction perpendicular to the top surface of the top substrate, a total thickness of the top substrate, the adhesive layer and the bottom substrate is equal to a thickness of the polymer.

5. The assembly as claimed in claim 1, wherein
the first chamfer and the second chamfer are flat.

6. The assembly as claimed in claim 1, wherein
the first chamfer and the second chamfer are curved inwardly toward the adhesive layer.

7. The assembly as claimed in claim 1, wherein
a thickness of the top substrate is thicker than a thickness of the bottom substrate.

* * * * *